(12) United States Patent
Runia et al.

(10) Patent No.: US 11,695,898 B2
(45) Date of Patent: Jul. 4, 2023

(54) VIDEO PROCESSING USING A SPECTRAL DECOMPOSITION LAYER

(71) Applicant: QUALCOMM Technologies, Inc., San Diego, CA (US)

(72) Inventors: Tom Frederik Hugo Runia, Amsterdam (NL); Cornelis Gerardus Maria Snoek, Volendam (NL); Arnold Wilhelmus Maria Smeulders, Amsterdam (NL)

(73) Assignee: Qualcomm Technologies, Inc., San Diego, CA (US)

( * ) Notice: Subject to any disclaimer, the term of this patent is extended or adjusted under 35 U.S.C. 154(b) by 0 days.

(21) Appl. No.: 17/572,510

(22) Filed: Jan. 10, 2022

(65) Prior Publication Data

US 2022/0132050 A1    Apr. 28, 2022

Related U.S. Application Data

(63) Continuation of application No. 16/827,456, filed on Mar. 23, 2020, now Pat. No. 11,223,782.

(60) Provisional application No. 62/821,947, filed on Mar. 21, 2019.

(51) Int. Cl.
*H04N 5/272* (2006.01)
*G06T 7/00* (2017.01)
*G06N 3/04* (2023.01)

(52) U.S. Cl.
CPC ............... *H04N 5/272* (2013.01); *G06N 3/04* (2013.01); *G06T 7/97* (2017.01); *G06T 2207/20081* (2013.01); *G06T 2207/20084* (2013.01)

(58) Field of Classification Search
CPC .......... H04N 5/272; H04N 9/31; H04N 13/04; G06T 7/97; G06T 2207/20081; G06T 2207/20084; G06N 3/04
USPC .................................................. 348/578, 411
See application file for complete search history.

(56) References Cited

U.S. PATENT DOCUMENTS

| | | | |
|---|---|---|---|
| 9,591,282 B2* | 3/2017 | Hyodo | H04N 13/122 |
| 9,693,048 B2 | 6/2017 | Smithwick | |
| 10,176,745 B2 | 1/2019 | Kang | |
| 10,354,397 B2* | 7/2019 | Davis | G06T 7/251 |
| 10,733,419 B2* | 8/2020 | Lee | G06V 10/30 |
| 10,972,718 B2 | 4/2021 | Kawabe et al. | |
| 11,200,424 B2* | 12/2021 | Lee | G06V 20/49 |
| 11,308,598 B2* | 4/2022 | Otroshi Shahreza | G06N 3/082 |
| 11,381,715 B2* | 7/2022 | Barbu | G06T 5/001 |
| 11,538,143 B2* | 12/2022 | Song | G06N 5/046 |
| 2007/0132680 A1 | 6/2007 | Kagawa et al. | |
| 2015/0189144 A1* | 7/2015 | Yoshii | H04N 13/239 |
| | | | 348/46 |
| 2020/0304729 A1 | 9/2020 | Runia et al. | |

\* cited by examiner

*Primary Examiner* — Trang U Tran
(74) *Attorney, Agent, or Firm* — Edward J. Meisarosh

(57) ABSTRACT

A method is presented. The method includes receiving a first sequence of frames depicting a dynamic element. The method also includes decomposing each spatial position from multiple spatial positions in the first sequence of frames to a frequency domain. The method further includes determining a distribution of spectral power density over a range of frequencies of the multiple spatial positions. The method still further includes generating a first set of feature maps based on the determined distribution of spectral power density over the range of frequencies. The method still further includes estimating a first physical property of the dynamic element.

18 Claims, 7 Drawing Sheets

VIDEO PROCESSING USING A SPECTRAL DECOMPOSITION LAYER

RELATED APPLICATIONS

This application is a continuation of U.S. patent application Ser. No. 16/827,456 titled "Video Processing Using a Spectral Decomposition Layer," filed Mar. 23, 2020, and claims the benefit of U.S. Provisional Patent Application No. 62/821,947 titled "ITERATIVE REFINEMENT OF PHYSICS SIMULATIONS," filed on Mar. 21, 2019. These documents are expressly incorporated by reference herein in their entirety.

BACKGROUND

Field

Aspects of the present disclosure generally relate to adaptive refinement of physics simulations.

Background

Artificial neural networks may comprise interconnected groups of artificial neurons (e.g., neuron models). The artificial neural network may be a computational device or represented as a method to be performed by a computational device. Convolutional neural networks, such as deep convolutional neural networks, are a type of feed-forward artificial neural network. Convolutional neural networks may include layers of neurons that may be configured in a tiled receptive field.

Deep convolutional neural networks (DCNs) are used in various technologies, such as vision systems, speech recognition, autonomous driving, and Internet of Things (IoT) devices. Conventional neural network vision systems may be used for object detection and three-dimensional (3D) reconstruction. Scene understanding is also a goal of a neural network vision system. Specifically, it is desirable to estimate physical properties of an object from a visual observation of the object.

SUMMARY

In one aspect of the present disclosure, a method is disclosed. The method includes receiving a first sequence of frames. The method also includes decomposing each spatial position from multiple spatial positions in the first sequence of frames to a frequency domain. The method further includes determining a distribution of spectral power density over a range of frequencies of the multiple spatial positions. The method still further includes generating a first set of feature maps based on the determined distribution of spectral power density over the range of frequencies.

Another aspect of the present disclosure is directed to an apparatus. The apparatus also includes means for receiving a first sequence of frames. The apparatus further includes means for decomposing each spatial position from multiple spatial positions in the first sequence of frames to a frequency domain. The apparatus still further includes means for determining a distribution of spectral power density over a range of frequencies of the multiple spatial positions. The apparatus still further includes means for generating a first set of feature maps based on the determined distribution of spectral power density over the range of frequencies.

In another aspect of the present disclosure, a non-transitory computer-readable medium with non-transitory program code recorded thereon is disclosed. The program code is executed by a processor and includes program code to receive a first sequence of frames. The program code also includes program code to decompose each spatial position from multiple spatial positions in the first sequence of frames to a frequency domain. The program code further includes program code to determine a distribution of spectral power density over a range of frequencies of the multiple spatial positions. The program code still further includes program code to generate a first set of feature maps based on the determined distribution of spectral power density over the range of frequencies.

Another aspect of the present disclosure is directed to an apparatus. The apparatus having a memory and one or more processors coupled to the memory. The processor(s) is configured to receive a first sequence of frames. The processor(s) is also configured to decompose each spatial position from multiple spatial positions in the first sequence of frames to a frequency domain. The processor(s) is further configured to determine a distribution of spectral power density over a range of frequencies of the multiple spatial positions. The processor(s) is still further configured to generate a first set of feature maps based on the determined distribution of spectral power density over the range of frequencies.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
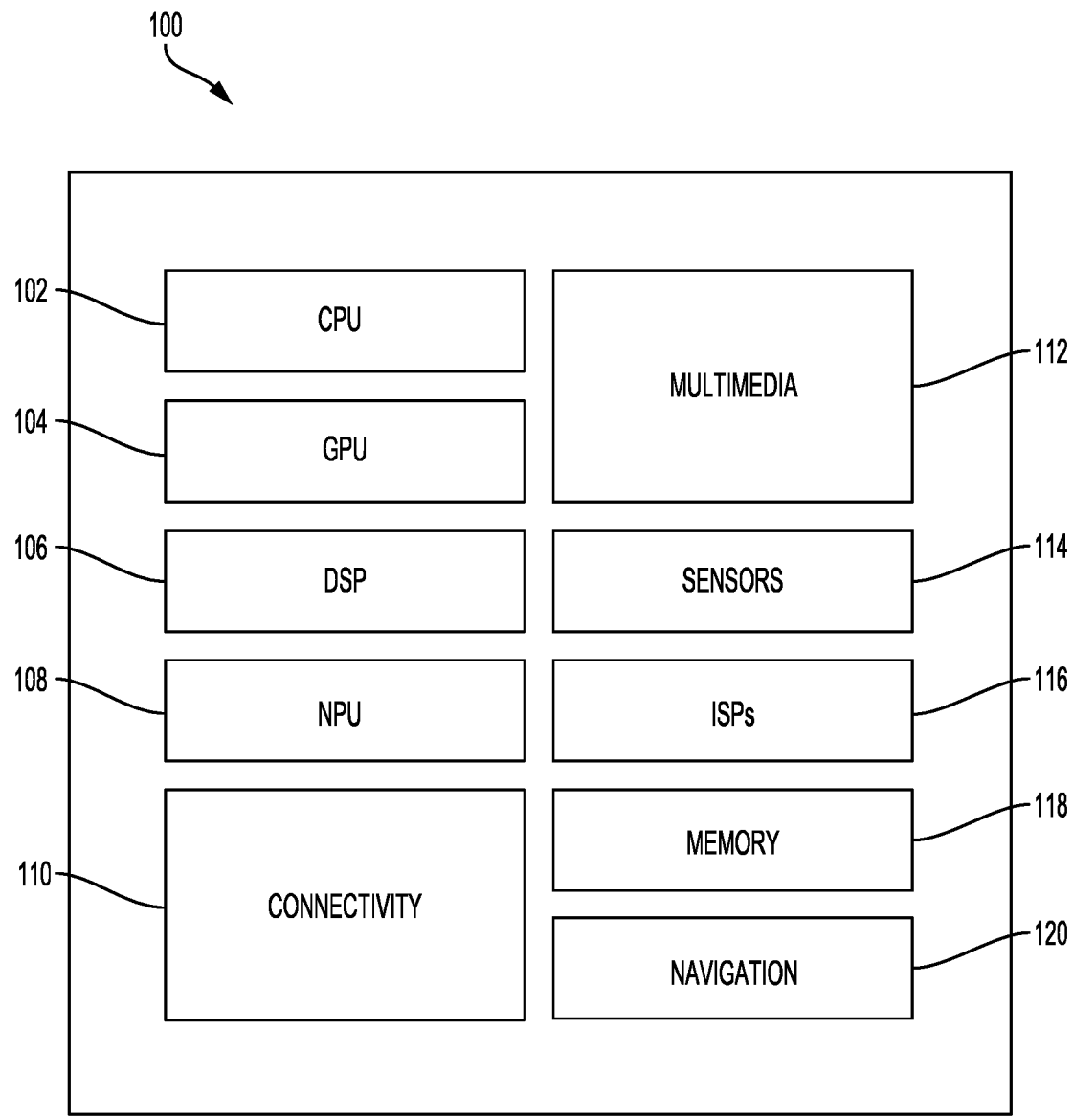
FIG. 1 illustrates an example implementation of designing a neural network using a system-on-a-chip (SOC), including a general-purpose processor in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

A goal of scene understanding is to estimate physical properties of an object from a visual observation of the object. Due to a number of underlying physical parameters, such as material properties and external forces, conventional vision systems may not generate accurate physical property estimations from visual observations. Aspects of the present disclosure are directed to improving a vision system's ability to estimate physical properties of an object from visual observations.

As an example, latent physical properties for a dynamic element, such as cloth blowing in the wind, may be estimated by a neural network to generate a simulation of the dynamic element. In one configuration, an iterative refinement procedure gradually learns physical properties by comparing a simulation of the dynamic element to a real-world observation. An embedding function that maps physically similar examples to nearby points may compare the simulation to the real-world observation.

Specifically, a simulation may be compared to a decomposed real-world observation. A spectral layer may be used to decompose the simulation and real-world observation to their temporal spectral power and corresponding frequencies. The physical properties may be iteratively updated based on the comparison. That is, the spectral layer (e.g., spectral decomposition layer) computes a representation (e.g., temporal spectral power) that is suitable for domain adaptation, such that a quality of a simulated video is above a threshold. The representation is an improvement to conventional neural networks that are prone to overfitting on pixel differences that do not accurately generate simulated videos.

FIG. 1 illustrates an example implementation of a system-on-a-chip (SOC) 100, which may include a central processing unit (CPU) 102 or a multi-core CPU configured for generating a synthetic representation of a physical object in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the general-purpose processor 102 may comprise code to receive a first sequence of frames. The general-purpose processor 102 may also comprise code to decompose each spatial position from multiple spatial positions in the first sequence of frames to a frequency domain. The general-purpose processor 102 may further comprise code to determine a distribution of spectral power density over a range of frequencies of the multiple spatial positions. The general-purpose processor 102 may still further comprise code to generate a first set of feature maps based on the determined distribution of spectral power density over the range of frequencies.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
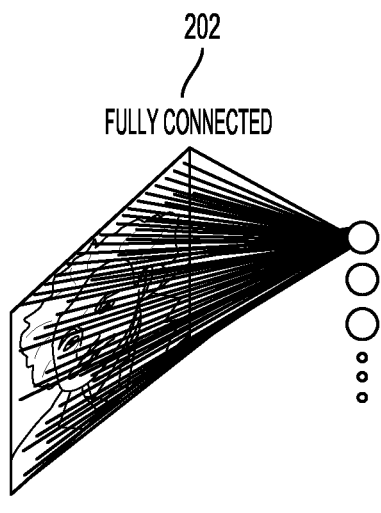
FIGS. 2A, 2B, and 2C are diagrams illustrating a neural network in accordance with aspects of the present disclosure.
Figure 2B:
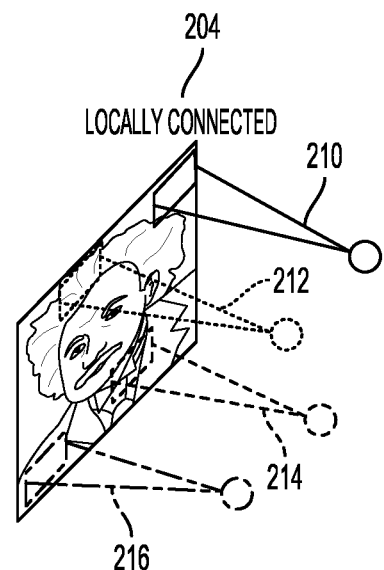

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
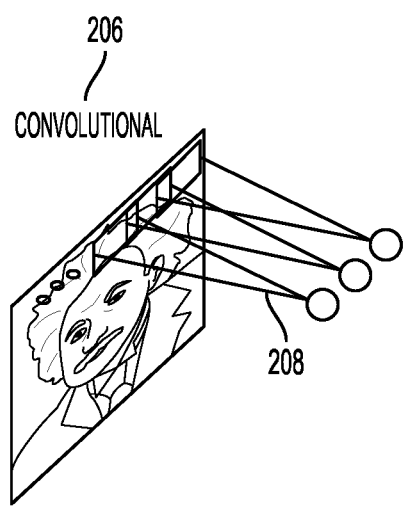

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful.

Figure 2D:
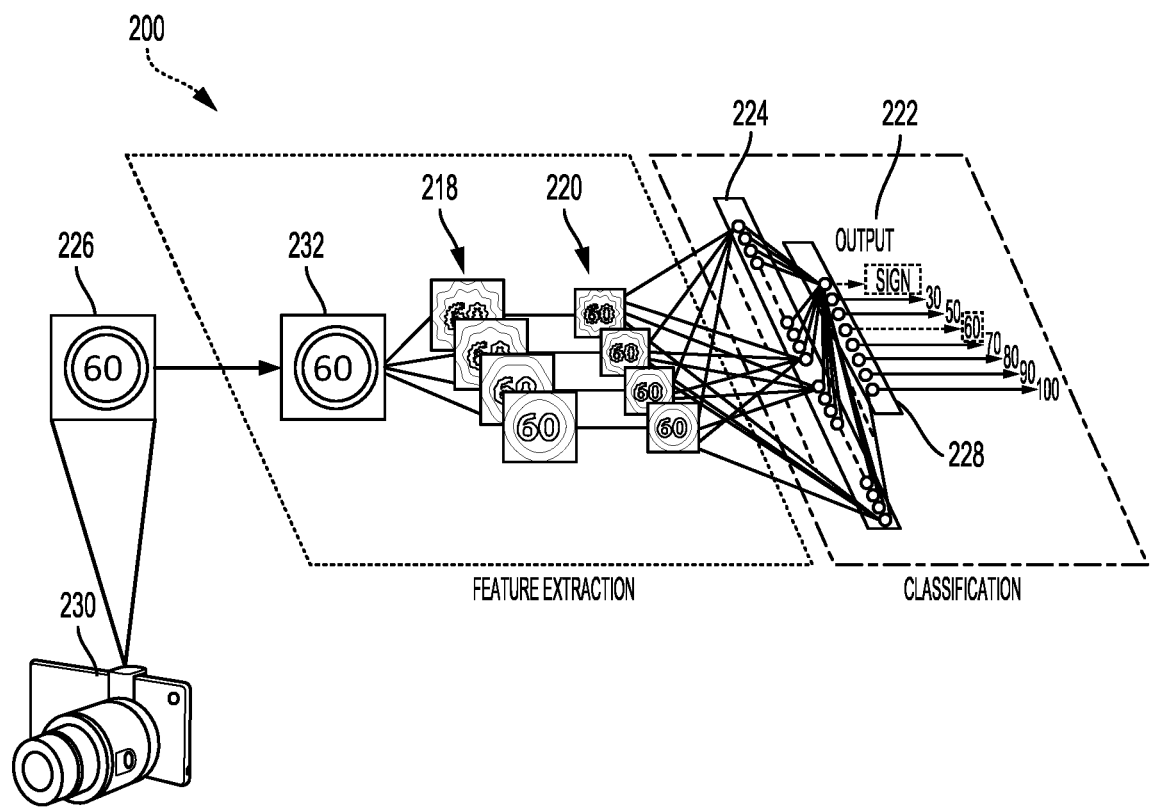
FIG. 2D is a diagram illustrating an exemplary deep convolutional network (DCN) in accordance with aspects of the present disclosure.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100". Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0, x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
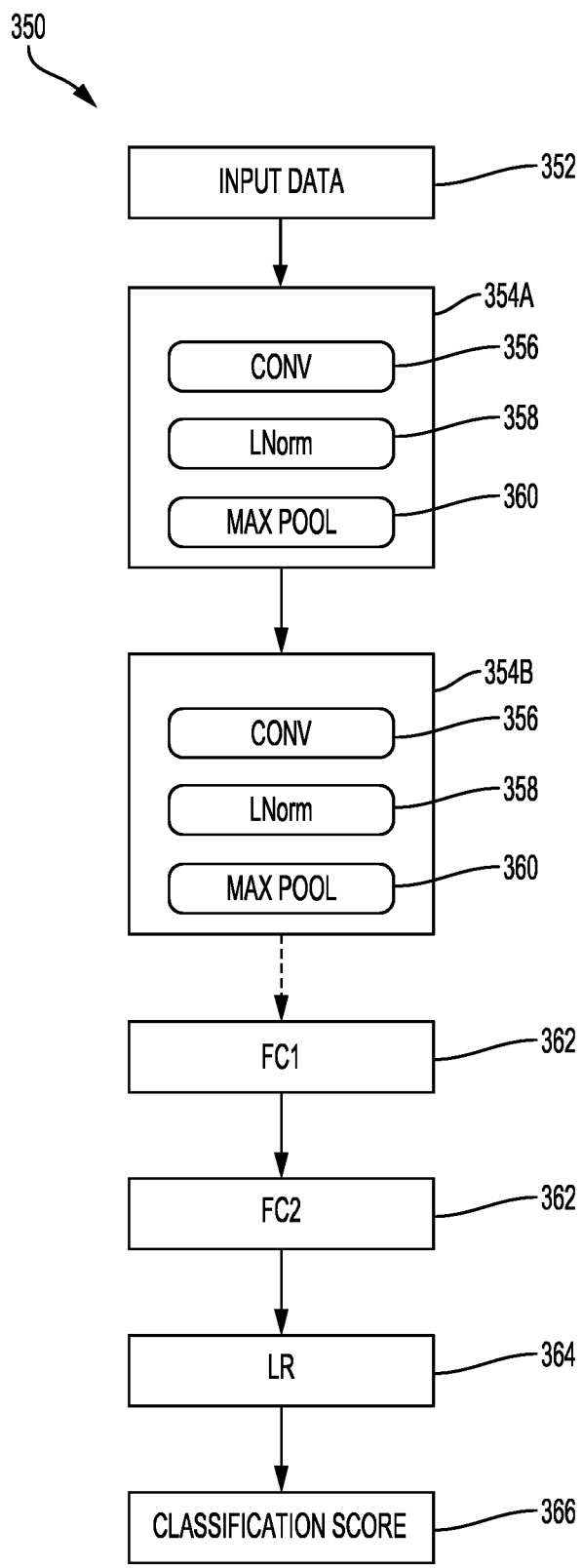
FIG. 3 is a block diagram illustrating an exemplary deep convolutional network (DCN) in accordance with aspects of the present disclosure.

FIG. 3 is a block diagram illustrating a deep convolutional network 350. The deep convolutional network 350 may include multiple different types of layers based on connectivity and weight sharing. As shown in FIG. 3, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative embodiments, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

As discussed, it is desirable to train a simulation model to estimate physical parameters of an object (e.g., dynamic object) or natural phenomenon. The physical parameters may be used to generate a rendering (e.g., simulation) of the object or natural phenomenon. Examples of objects and natural phenomena include flags blowing in the wind, hanging fabric, smoke, draped clothing, swaying trees, fire, and water. For brevity, the objects and natural phenomenon may be referred to as dynamic elements.

Aspects of the present disclosure are directed to an iterative feedback loop for adjusting physical parameters based on real-world visual observations. In one configuration, synthetic data is used to train the vision system (e.g., deep neural network). For illustrative purposes, aspects of the present disclosure are described with respect to fabric (e.g., cloth) that is subject to external forces (e.g., wind). However, aspects of the present disclosure may be applicable to other dynamic elements. The iterative feedback loop for adjusting physics simulations based on visual observations may be referred to as an iterative refinement loop.

In some cases, physical parameters (e.g., material properties) of a dynamic element may be inferred from visual observations. Still, merely inferring physical parameters of the dynamic element from a visual observation (e.g., video) may lead to an inaccurate model. That is, when using simulations and renderings for learning, a visually appealing rendering does not necessarily imply a realistic rendering. Therefore, it is desirable to determine a similarity of underlying physical parameters rather than a visual correspondence.

Aspects of the present disclosure improve physical parameter estimations by iteratively tuning the physical parameter estimations based on visual observations. Specifically, aspects of the present disclosure tune the parameters based on a physical similarity of real and simulated observations.

In one configuration, a simulation engine determines physical parameters of a dynamic element to generate material property estimations (e.g. 3D meshes, point clouds, flow vectors). A rendering engine may use the material property estimations to render a simulation (e.g., an image or video) of the dynamic element. The simulation may be compared with a real-world observation of the dynamic element.

The real-world observation may include ground-truth external force measurements (e.g., wind speed gauged with an anemometer). An iterative process refines the physical parameters by maximizing a physical similarity between a real-world observation and a simulation. The similarity may be determined by a comparison model. Realism of the simulations may be improved by updating the physical parameters.

Aspects of the present disclosure train the comparison model using only simulations of dynamic elements (e.g., without observing a real-world manifestation of the dynamic elements). The comparison model determines a similarity of two visual observations based on a distance metric. The comparison model may be implemented as a Siamese network trained with a contrastive loss.

In one configuration, the iterative refinement framework receives a real-world video segment of a dynamic element. The real-world dynamic element may be, for example, a flag in the wind, hanging fabric, smoke, draped clothing, swaying trees, fire, or water. The real-world video segment may be obtained from a video dataset of dynamic elements subjected to external forces (e.g., flags waving in the wind).

The iterative refinement framework may be initialized using pre-defined physical parameters (e.g., material properties and/or external forces). As an example, the iterative process is initialized with pre-defined material properties (e.g., nylon) and a pre-defined external force (e.g., wind). A synthetic video segment is rendered from a representation of the pre-defined material properties and the pre-defined external force. The pre-defined material properties and the pre-defined external force of the synthetic video segment may be tuned based on comparisons with real-world observations of the material properties and the external force.

To simulate dynamic elements (e.g., flags in the wind, hanging fabric, smoke, draped clothing, swaying trees, fire, or water), a simulator, such as an ARCSim physics simulator, renders a simulation of a physical object (e.g., cloth) based on physical parameters, such as material properties and external forces (e.g., gravity and wind). The simulator may include pre-defined fabric types. Still, the exact material properties, such as bending and stiffness parameters may be unknown. The ARCSim physics simulator is a simulation engine for animating sheets of deformable materials such as cloth, paper, plastic, and metal. The simulation engine uses adaptively refined meshes to resolve geometric and dynamic details of a simulated object.

In one configuration, a simulation engine generates representations of the pre-defined material properties and the pre-defined external force. The synthetic video segment is rendered based on the output of the simulation engine. A similarity function determines whether a quality of the synthetic video segment relative to the real-world video clip satisfies a quality threshold. The similarity function is defined based on a first similarity function parameter associated with the real-world video segment and a second similarity function parameter based on a synthetic video segment.

The similarity function may be implemented as deep neural network with a spectral decomposition layer. The similarity function may be trained using a contrastive loss. In one configuration, the similarity function is trained with only simulated data. That is, the similarity function is trained without ever having a seen a real example of a dynamic element.

The iterative process further includes updating the pre-defined physical parameters based on the comparison. In one configuration, the comparison is based on spectral components of the synthetic video clip and the real-world observations. The spectral components may be generated by a spectral decomposition layer. The iterative process continues until the quality of the synthetic video segment exceeds a pre-defined threshold. The synthetic video clip may be a rendered animation.

In one configuration, the spectral decomposition layer decomposes a sequence of H×W frames into its temporal frequencies for each spatial location (e.g., pixel), where H is the height and W is the width of each frame. In one configuration, the spectral decomposition layer generates spectral power and frequency maps from a received sequence of frames. The spectral power and frequency maps indicate dominant frequencies for each spatial position in the video. The spectral power and frequency maps may also be referred to as feature maps. The spectral power and frequency maps may be processed by a number of convolution layers to learn a mapping between the visual observations and external forces (e.g., wind).

The iterative refinement framework improves physics simulations and may be applied to a variety of applications, such as computer graphics, three-dimensional gaming engines, and video augmentation with synthetic structures. Aspects of the present disclosure may also be used for virtual clothing. For example, a virtual system for trying-on clothes may estimate clothing properties from a video. The estimated properties may be used to simulate a look of the clothing on an individual.

Figure 4:
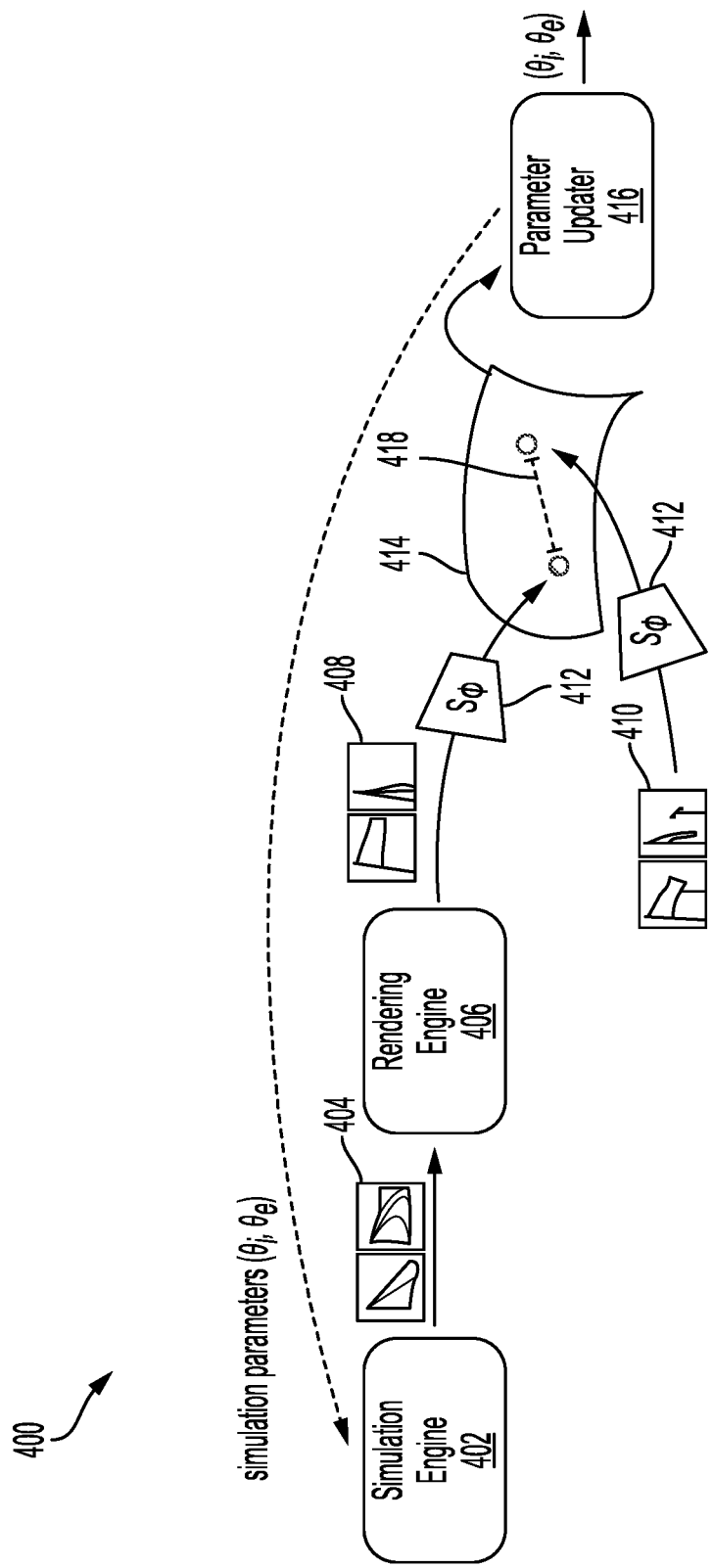
FIG. 4 illustrates an example of an iterative refinement framework in accordance with aspects of the present disclosure.

FIG. 4 illustrates an example of an iterative refinement framework 400 according to aspects of the present disclosure. For illustrative purposes, FIG. 4 is described with respect flags flying in the wind. Aspects of the present disclosure are not limited to flags flying in the wind. Aspects of the present disclosure may be applicable to other objects and/or other real-world visual phenomena such as hanging fabric, smoke, turbulence, draped clothing, swaying trees, fire, or water.

As shown in FIG. 4, the iterative refinement framework 400 includes a simulation engine 402 and a rendering engine 406. The simulation engine 402 may also be referred to as a physics simulator. The simulation engine 402 selects simulation parameters $\Theta$ to generate a dataset of intermediate representations 404 (e.g., 3D meshes, point clouds, or flow vectors). The simulation parameters $\Theta$ include intrinsic properties $\Theta_i$ and external forces $\Theta_e$ randomly sampled from a predefined search space. For example, the intrinsic properties $\Theta_i$ include fabric size and fabric parameters and the external forces $\Theta_e$ include wind parameters.

In one configuration, the simulation engine 402 generates three-dimensional (3D) meshes 404 from the simulation parameters $\Theta$. That is, the 3D meshes 404 may be one of the intermediate representations 404. In the example of FIG. 4, the 3D meshes 404 are 3D cloth meshes. A 3D mesh may include a set of vertices, edges, and faces defining a shape of a 3D object. The intermediate representations 404 are input to the rendering engine 406.

For each intermediate representation 404 from the dataset of intermediate representations 404, the rendering engine 406 generates multiple synthetic video segments 408 with different rendering parameters. Each synthetic video segment 408 may have a dimension of H×W, where H is a number of pixels for a height of a video frame and W is a number of pixels for a width of the video frame. Additionally, each synthetic video segment 408 may include multiple frames and one or more image channels. In one configuration, the synthetic video segments 408 simulate a dynamic element in a three-dimensional environment, where an appearance of the synthetic video segment 408 is controlled. For example, flag texture, scene lighting, and camera parameters may be controlled.

Real-world video segments 410 (e.g., target video segment) of the dynamic elements in the synthetic video segments 408 are provided to the iterative refinement framework 400. The dynamic element (e.g., a flag) in the real-world video segments 410 has the same characteristics and same external forces (e.g., wind) as the dynamic element of the synthetic video segments 408. The real-world video segments 410 are compared with the synthetic video segments 408.

Specifically, an embedding function 412 maps the synthetic video segments 408 and the real-world video segments 410 to an embedding space 414 (e.g., a manifold) on which physically similar examples are assigned to nearby points. A distance metric in the embedding space 414 measures a similarity between the synthetic video segments 408 and the real-world video segments 410.

A similarity function measures a similarity between the synthetic video segments 408 and the real-world video segments 410. The similarity function reflects correspondence in physical dynamics between the two instances. In one configuration, the similarity function first learns the distance metric from only synthetic video segments 408. That is, the distance metric may be learned from a contrastive loss based on positive example pairs and negative example pairs of synthetic video segments 408.

Positive example pairs are synthetic video segments 408 originating from a same simulation (e.g., sharing simulation parameters $\Theta$). Negative example pairs are synthetic video segments 408 with different simulation parameters $\Theta$. Pairs of synthetic video segments 408 may be mapped to the embedding space 414 through the embedding function 412 in a Siamese fashion.

The embedding function may convolve the input video (e.g., synthetic video segments 408 and real-world video segments 410) with multiple filters, such as a temporal Gaussian filter followed by two spatially oriented first-order derivative filters. Two different filtered videos are generated from the filtering. The filtered videos may be subsampled. For example, max pooling may be applied to subsample the filtered videos.

The filtered video representations may be input to a spectral decomposition layer to produce spectral power and frequency maps. The outputs are stacked into a multi-channel feature map to be further processed by convolutional layers (e.g., two-dimensional convolutional layers). The output of the convolutional layers may be mapped to the embedding space 414.

In the embedding space 414, a physical similarity may be evaluated using a squared Euclidean distance. If measured over a collection of synthetic video segments 408, the contrastive loss pulls together physically similar examples, whereas physically dissimilar points are pushed apart. As a result, by training only on synthetic video segments 408, aspects of the present disclosure learn to measure a similarity between synthetic video segments 408 and the real-world video segments 410. After completing the training, when observing a real video in the iterative framework, an embedding function projects both a current simulated video and real video to the embedding space 414. The Euclidean distance 418 computed in the embedding space 414 guides the parameter optimization.

In one configuration, the simulation parameters $\Theta$ are iteratively updated based on a result of the comparison. Specifically, a parameter updater 416 is used to minimize a distance between the synthetic video segments 408 and real-world video segments 410. After each comparison, the parameter updater 416 updates the simulation parameters $\Theta$ until a stop criteria is satisfied. The stop criteria may be satisfied when an accuracy threshold is satisfied or an evaluation budget is consumed. The evaluation budget may be defined by available computing resources and/or a maximum amount of time available for running the refinement (or both). The evaluation budget may be fixed or dynamic.

The parameter updater 416 outputs the refined simulation parameters $\Theta$ when the iterative process is terminated. An optimization scheme, such as Bayesian optimization, updates the simulation parameters $\Theta$. In one configuration, in addition to local gradient information, the simulation parameters $\Theta$ are updated based on information from previous observations.

In one configuration, using the example of a flag flying in the wind, the rendering engine 406 generates synthetic video segments 408 using a two-step process. First, a physics engine or simulator (e.g., the ArcSim physics simulator) simulates dynamics of the element. Additionally, meshes are rendered in a 3D environment with full control over flag texture, lighting, and camera position. The meshes may be rendered based on material properties and external forces (e.g., gravity and wind). The meshes are provided to a rendering engine to generate the rendered animations. The material properties may include bending properties, shearing properties, and stretching properties. The aspects of the present disclosure match material properties obtained for the synthetic flag to the material properties of the real-world flag. Additionally, aspects of the present disclosure match external forces affecting the material of the real-world flag to external forces obtained for the synthetic flag.

As discussed, the real-world video segments 410 include ground-truth external force measurements. For example, wind speed may be measured in real-time (e.g., a sampling frequency of two Hertz (2 Hz)) while recording the videos for a real-world flag dataset. In one example, wind speed is measured by hoisting an anemometer onto a flag pole so that it is directly positioned next to the flag.

A frequency decomposition may be extracted from the video segments. The frequency decomposition may include changes to the frequency over a surface of the element and the direction of the change. Thus, a static frequency map and power map for a video segment may be obtained. Each spectral power at a spatial location (e.g., pixel) corresponds to a particular frequency. A frequency map may identify high and low frequencies regions. The spectral decomposition layer extracts the frequency decomposition.

Figure 5:
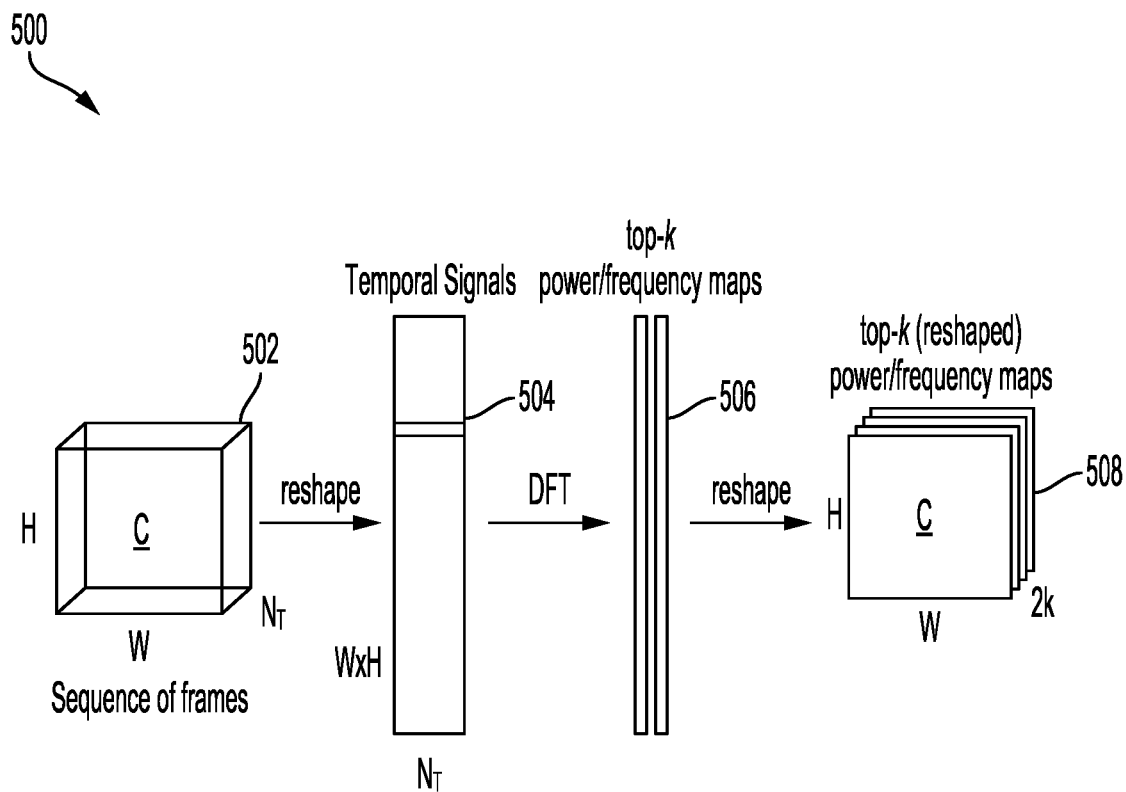
FIG. 5 illustrates a spectral decomposition layer in accordance with aspects of the present disclosure.

FIG. 5 illustrates spectral decomposition layer 500 according to aspects of the present disclosure. The spectral decomposition layer 500 distills temporal frequencies from a video. A spatial arrangement of low frequency and high frequency regions may be inferred from the distilled temporal frequencies. As shown in FIG. 5, temporal signals 504 are generated from a sequence of frames 502. The sequence of frames 502 may represent an input video. The sequence of frames may have a multi-dimensional relationship represented with tensors. For example, the tensors may have a shape represented by $C \times N_t \times H \times W$, where $N_t$ represents a spatial size (e.g., number of frames), C represents a number of channels (e.g., three channels for an RGB frame), W represents a width in pixels of each frame, and H represents a height in pixels of each frame. FIG. 5 illustrates an example of one channel C.

In one configuration, the sequence of frames 502 is treated as a collection of signals (e.g., $H \times W$ signals) for each spatial position (e.g., pixel). The sequence of frames 502 may be reshaped to a collection of temporal signals 504. A discrete Fourier transform (DFT) maps the temporal signals 504 to a frequency domain. A spatial distribution of a temporal spectral power of the sequence of frames 502 is determined from the frequency domain mapping.

The DFT maps a signal f(N) for $n \in [0, N_t-1]$ into the frequency domain by:

$$F(j\omega) = \Sigma_{n=0}^{N_t-1} f[n] e^{-j\omega nT}, \quad (1)$$

where, $\omega$ is a frequency, and j is an imaginary number of the DFT. The DFT's output may be mapped to a real-valued representation. The periodogram of a signal is a representation of its spectral power and is defined $$I(\omega) = \frac{1}{N_t} |F(j\omega)|^2.$$

$I(\omega)$ provides a spectral power magnitude at each sampled frequency.

In one configuration, the top-k strongest frequencies and corresponding spectral power 506 of the periodogram are selected to reduce dimensionality and emphasize the video's discriminative frequencies. Given a signal of an arbitrary length, selecting the top-k frequencies generates k pairs including $I(\omega_{max_i})$ and $\omega_{max_i}$ for $i \in [0, k]$, thus yielding 2k scalar values.

The spectral decomposition layer 500 generates a multi-channel feature map 508 based on the top-k frequencies. That is, for a sequence of frames 502 (e.g., $C \times N_t \times H \times W$), the spectral decomposition produces 2k feature maps of size $H \times W$ (e.g., 2k $C \times H \times W$), where the factor two indicates that both the power map and frequency map are stacked in the final output. When k equals one, only a single dominant frequency is selected. Additionally, when k equals two, the two most dominant frequencies in the signal are selected. The output representation may be a feature map with multiple channels and can serve as input to consecutive layers in a deep learning architecture.

The spectral decomposition layer may be a building block of a neural network architecture for performing spectral decomposition. Thus, the spectral decomposition layer is used to perform an explicit temporal spectral decomposition inside a deep learning architecture.

Prior to processing the sequence of frames 502, the sequence of frames 502 may be spatially decomposed into dominant orientation bands. For example, Gaussian derivative filters may decompose the sequence of frames 502. Additionally, or alternatively, the sequence of frames 502 may be spatially subsampled to reduce computation. The spectral power maps and frequency maps produced by the spectral decomposition layer 500 may be processed by convolutional layers. Discriminative spectral-based feature maps may be learned for a particular task using backpropagation through the trainable layers of the network.

Figure 6:
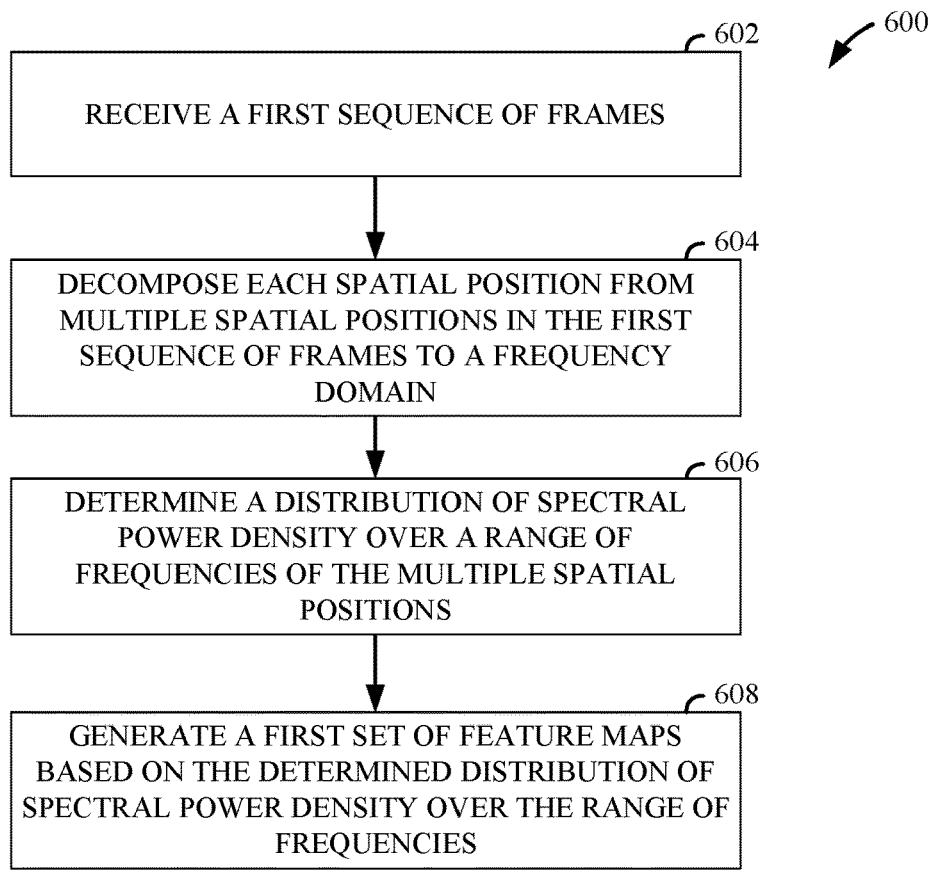
FIG. 6 illustrates a flow diagram for a method in accordance with aspects of the present disclosure.

FIG. 6 illustrates a method in accordance with aspects of the present disclosure. The example process 600 is an example of spectral decomposition layer of an artificial neural network. As shown in FIG. 6, the spectral decomposition layer receives a sequence of frames (block 602). The sequence of frames may be referred to as a three-dimensional volume.

The video may be a real-world or synthetic example of a dynamic element. A real-world example refers to an actual occurrence of a dynamic element as opposed to a synthetically generated occurrence of a dynamic element. The dynamic element may be influenced by external forces, such as wind. Additionally, the dynamic element may be an element such as fabric, smoke, or water.

As shown in FIG. 6, in some aspects, the spectral decomposition layer decomposes each spatial position from multiple spatial positions in the first sequence of frames to a frequency domain (block 604). The spatial positions may be pixels in the sequence of frames. Additionally, the spectral decomposition layer determines a distribution of spectral power density over a range of frequencies of the multiple spatial positions (block 606). Finally, as shown in FIG. 6, the spectral decomposition layer generates a first set of feature maps based on the determined distribution of spectral power density over the range of frequencies (block 608).

The various operations of methods described above may be performed by any suitable means capable of performing the corresponding functions. The means may include various hardware and/or software component(s) and/or module(s), including, but not limited to, a circuit, an application specific integrated circuit (ASIC), or processor. Generally, where there are operations illustrated in the figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general-purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, erasable programmable read-only memory (EPROM), electrically erasable programmable read-only memory (EEPROM), registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a device. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement signal processing functions. For certain aspects, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, random access memory (RAM), flash memory, read only memory (ROM), programmable read-only memory (PROM), erasable programmable read-only memory (EPROM), electrically erasable programmable Read-only memory (EEPROM), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the device, all which may be accessed by the processor through the bus interface. Alternatively, or in addition, the machine-readable media, or any portion thereof, may be integrated into the processor, such as the case may be with cache and/or general register files. Although the various components discussed may be described as having a specific location, such as a local component, they may also be configured in various ways, such as certain components being configured as part of a distributed computing system.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may comprise one or more neuromorphic processors for implementing the neuron models and models of neural systems described herein. As another alternative, the processing system may be implemented with an application specific integrated circuit (ASIC) with the processor, the bus interface, the user interface, supporting circuitry, and at least a portion of the machine-readable media integrated into a single chip, or with one or more field programmable gate arrays (FPGAs), programmable logic devices (PLDs), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module. Furthermore, it should be appreciated that aspects of the present disclosure result in improvements to the functioning of the processor, computer, machine, or other system implementing such aspects.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Additionally, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A computer-implemented method, comprising:
   receiving a first sequence of frames depicting a dynamic element;
   decomposing each spatial position from a plurality of spatial positions in the first sequence of frames to a frequency domain;
   determining a distribution of spectral power density over a range of frequencies of the plurality of spatial positions;
   generating a first set of feature maps based on the determined distribution of spectral power density over the range of frequencies; and
   estimating a first physical property of the dynamic element.

2. The method of claim 1, wherein the dynamic element comprises one of cloth, fabric, smoke, fire, water, and trees.

3. The method of claim 1, wherein the first physical property is a material property of the dynamic element.

4. The method of claim 3, wherein the material property estimation is in the form of a 3D mesh, a point cloud, or a flow vector.

5. The method of claim 3, wherein the material property is one of a bending property, a shearing property, and a stretching property.

6. The method of claim 1, wherein the first physical property is an external force acting on the dynamic element.

7. An apparatus, comprising:
   a memory unit; and
   at least one processor coupled to the memory unit, the at least one processor configured:
   to receive a first sequence of frames depicting a dynamic element;
   to decompose each spatial position from a plurality of spatial positions in the first sequence of frames to a frequency domain;
   to determine a distribution of spectral power density over a range of frequencies of the plurality of spatial positions;
   to generate a first set of feature maps based on the determined distribution of spectral power density over the range of frequencies; and
   to estimate a first physical property of the dynamic element.

8. The apparatus of claim 7, wherein the dynamic element comprises one of cloth, fabric, smoke, fire, water, and trees.

9. The apparatus of claim 7, wherein the first physical property is a material property of the dynamic element.

10. The apparatus of claim 9, wherein the material property estimation is in the form of a 3D mesh, a point cloud, or a flow vector.

11. The apparatus of claim 9, wherein the material property is one of a bending property, a shearing property, and a stretching property.

12. The apparatus of claim 7, wherein the first physical property is an external force acting on the dynamic element.

13. A non-transitory computer-readable medium having program code recorded thereon, the program code executed by a processor and comprising:

program code to receive a first sequence of frames depicting a dynamic element;

program code to decompose each spatial position from a plurality of spatial positions in the first sequence of frames to a frequency domain;

program code to determine a distribution of spectral power density over a range of frequencies of the plurality of spatial positions;

program code to generate a first set of feature maps based on the determined distribution of spectral power density over the range of frequencies;

program code to estimate a first physical property of the dynamic element.

14. The non-transitory computer-readable medium of claim 13, wherein the dynamic element comprises one of cloth, fabric, smoke, fire, water, and trees.

15. The non-transitory computer-readable medium of claim 13, wherein the first physical property is a material property of the dynamic element.

16. The non-transitory computer-readable medium of claim 15, wherein the material property estimation is in the form of a 3D mesh, a point cloud, or a flow vector.

17. The non-transitory computer-readable medium of claim 15, wherein the material property is one of a bending property, a shearing property, and a stretching property.

18. The non-transitory computer-readable medium of claim 13, wherein the first physical property is an external force acting on the dynamic element.

* * * * *